United States Patent
Kasano et al.

(10) Patent No.: US 8,665,397 B2
(45) Date of Patent: Mar. 4, 2014

(54) BACKLIGHT UNIT, LIQUID CRYSTAL DISPLAY APPARATUS USING THE SAME, AND LIGHT-EMITTING DIODE USED THEREFOR

(75) Inventors: Masahiro Kasano, Osaka (JP); Kouki Ichihashi, Osaka (JP)

(73) Assignee: Panasonic Corporation, Osaka (JP)

( * ) Notice: Subject to any disclaimer, the term of this patent is extended or adjusted under 35 U.S.C. 154(b) by 72 days.

(21) Appl. No.: 13/401,411

(22) Filed: Feb. 21, 2012

(65) Prior Publication Data

US 2012/0147292 A1 Jun. 14, 2012

Related U.S. Application Data

(63) Continuation of application No. PCT/JP2011/005157, filed on Sep. 14, 2011.

(30) Foreign Application Priority Data

Sep. 14, 2010 (JP) ................................. 2010-205108

(51) Int. Cl.
*G02F 1/1335* (2006.01)
*F21Y 101/02* (2006.01)

(52) U.S. Cl.
CPC ........... *G02F 1/1335* (2013.01); *F21Y 2101/02* (2013.01)
USPC .................................. 349/64; 349/61; 257/98

(58) Field of Classification Search
CPC .............................. G02F 1/1335; F21Y 2101/02
USPC .......................................... 349/61, 64; 257/98
See application file for complete search history.

(56) References Cited

U.S. PATENT DOCUMENTS

| 5,345,074 A * | 9/1994 | Tonai et al. ................. 250/214.1 |
| 7,021,813 B2 * | 4/2006 | Lee et al. ....................... 362/609 |
| 7,078,735 B2 | 7/2006 | Shono et al. |
| 7,932,527 B2 | 4/2011 | Shono et al. |
| 2005/0073495 A1 | 4/2005 | Harbers et al. |
| 2005/0230699 A1 | 10/2005 | Wu et al. |
| 2006/0221592 A1 * | 10/2006 | Nada et al. ....................... 362/29 |
| 2008/0173863 A1 | 7/2008 | Hahn et al. |
| 2009/0296413 A1 | 12/2009 | Fukui |
| 2010/0110667 A1 * | 5/2010 | Takata .......................... 362/97.3 |

FOREIGN PATENT DOCUMENTS

| JP | 04-100277 A | 4/1992 |
| JP | 2001-007399 A | 1/2001 |
| JP | 2004-311973 A | 11/2004 |
| JP | 2005-115372 A | 4/2005 |
| JP | 2006-260912 A | 9/2006 |
| JP | 2007-288195 A | 11/2007 |
| JP | 2009-094199 A | 4/2009 |
| JP | 2009-289772 A | 10/2009 |

OTHER PUBLICATIONS

International Search Report issued in International Patent Application No. PCT/JP2011/005157, dated Oct. 11, 2011.

* cited by examiner

*Primary Examiner* — Lucy Chien
(74) *Attorney, Agent, or Firm* — McDermott Will & Emery LLP

(57) ABSTRACT

There are provided light-emitting layer provided on transparent substrate and emitting light of a specific wavelength, mirror layer formed on a light exit side of light-emitting layer and including a function of reflecting light emitted from light-emitting layer, reflecting layer provided on a side of substrate in a manner to interpose light-emitting layer between mirror layer and reflecting layer; and a diffusion layer that diffuses light emitted from light-emitting layer is disposed between mirror layer and reflecting layer.

20 Claims, 9 Drawing Sheets

B:$(Sr, Ca, Ba, Mg)_{10}(PO_4)_6C_{12}$:Eu
G:ZnS:Cu, Al
R:$Y_2O_2S$:Eu

US 8,665,397 B2

BACKLIGHT UNIT, LIQUID CRYSTAL DISPLAY APPARATUS USING THE SAME, AND LIGHT-EMITTING DIODE USED THEREFOR

RELATED APPLICATIONS

This is a continuation application under 35 U.S.C. 111(a) of International Application No. PCT/JP2011/005157, filed on Sep. 14, 2011, which in turn claims the benefit of Japanese Application No. 2010-205108, filed on Sep. 14, 2010, the disclosures of which Applications are incorporated by reference herein.

TECHNICAL FIELD

The present invention relates to a backlight unit, a liquid crystal display apparatus using the same, and a light-emitting diode (hereinafter, referred to as the "LED") used therefor.

BACKGROUND ART

In a backlight unit of a large-sized liquid crystal display apparatus, a plurality of cold-cathode tubes is arranged immediately below a liquid crystal panel. These cold-cathode tubes are used together with members such as a reflecting plate that reflects emitted light from the cold-cathode tubes to a side of the liquid crystal panel and a diffuser plate for diffusing light emitted from the cold-cathode tubes to thereby make a surface light source.

In recent years, a light-emitting diode has been used as a light source of this type of backlight unit. The light-emitting diode has been improved recently in its efficiency and is expected as a light source that consumes less power and replaces a fluorescent lamp. Additionally, when the light-emitting diode is used as a light source of the liquid crystal display apparatus, it is possible to reduce the power consumption of the liquid crystal display apparatus by controlling the brightness of the light-emitting diode according to video images.

Incidentally, as a light-emitting diode for a liquid crystal display apparatus, a type in which a blue light-emitting diode using a GaN semiconductor as an active layer is combined with a phosphor is becoming mainstream.

FIG. 15 is a diagram illustrating a structure of a GaN light-emitting diode disclosed in PTL 1. As illustrated in FIG. 15, in the light-emitting diode, n-type contact layer 32 formed of an n-type GaN film and n-type clad layer 33 are formed on sapphire substrate 31 via a buffer layer (not illustrated). Light-emitting layer 34 formed of an InGaN film is formed on n-type clad layer 33, and p-type clad layer 35 formed of a p-type AlGaN film and p-type contact layer 36 formed of a p-type GaN film are formed on light-emitting layer 34 sequentially from a bottom thereof. N-type electrode 37 is formed on n-type contact layer 32, and p-type electrode 38 is formed on p-type contact layer 36. Light-emitting layer 34 emits light by applying a voltage between n-type electrode 37 and p-type electrode 38.

According to the light-emitting diode disclosed in PTL 1, a largest amount of light is emitted in a front direction of a chip of the light-emitting diode. Therefore, light emitted from the chip in the front direction is diffused by refraction using a lens, through a concave face near an optical axis, so that luminance on an illuminated surface near the optical axis is subdued, and an illumination distribution is made wider.

It is an object of the present invention to provide a light-emitting diode having a light-emitting characteristic with wider distribution of light, a backlight unit that is inexpensive and has a high efficiency using this light-emitting diode, and a liquid crystal display apparatus having an improved image quality using this backlight unit.

CITATION LIST

Patent Literature

PTL 1: Unexamined Japanese Patent Publication No. 2001-7399

SUMMARY OF THE INVENTION

A backlight unit according to the present invention includes light-emitting means that emits light of a specific color and includes a light-emitting diode that comprises:
   a light-emitting layer provided on a transparent substrate and emitting light of a specific wavelength;
   a first reflecting layer formed on a light exit side relative to the light-emitting layer and including a function of reflecting light emitted from the light-emitting layer; and
   a second reflecting layer provided on a side of the substrate in a manner to interpose the light-emitting layer between the first reflecting layer and the second reflecting layer.
   A diffusion layer that diffuses light emitted from the light-emitting layer is disposed between the first reflecting layer and the second reflecting layer.

A liquid crystal display apparatus according to the present invention includes a backlight unit including light-emitting means that emits light of a specific color, and a liquid crystal panel configured to receive light from the backlight unit incident on a rear side thereof and display an image. The light-emitting means is a light-emitting diode that includes:
   a light-emitting layer provided on a transparent substrate and emitting light of a specific wavelength;
   a first reflecting layer formed on a light exit side relative to the light-emitting layer and including a function of reflecting light emitted from the light-emitting layer; and
   a second reflecting layer provided on a side of the substrate in a manner to interpose the light-emitting layer between the first reflecting layer and the second reflecting layer.
   A diffusion layer that diffuses light emitted from the light-emitting layer is disposed between the first reflecting layer and the second reflecting layer.

A light-emitting diode according to the present invention includes:
   a light-emitting layer provided on a transparent substrate and emitting light of a specific wavelength;
   a first reflecting layer formed on a light exit side relative to the light-emitting layer and including a function of reflecting light emitted from the light-emitting layer; and
   a second reflecting layer provided on a side of the substrate in a manner to interpose the light-emitting layer between the first reflecting layer and the second reflecting layer.
   A diffusion layer that diffuses light emitted from the light-emitting layer is disposed between the first reflecting layer and the second reflecting layer.

According to the backlight unit configured as described above, it is possible to obtain a backlight unit that is inexpensive, high-efficient, and with reduced color unevenness.

According to the liquid crystal display apparatus configured as described above, it is possible to obtain a liquid crystal display apparatus that can improve the image quality.

According to the light-emitting diode configured as described above, it is possible to obtain a light-emitting diode having a light-emitting characteristic with wider distribution of light.

DESCRIPTION OF EMBODIMENTS

Hereinafter, a backlight unit according to an exemplary embodiment of the present invention will be described with reference to the drawings.

The backlight unit according to the exemplary embodiment is a subjacent-type backlight unit.

Figure 1:
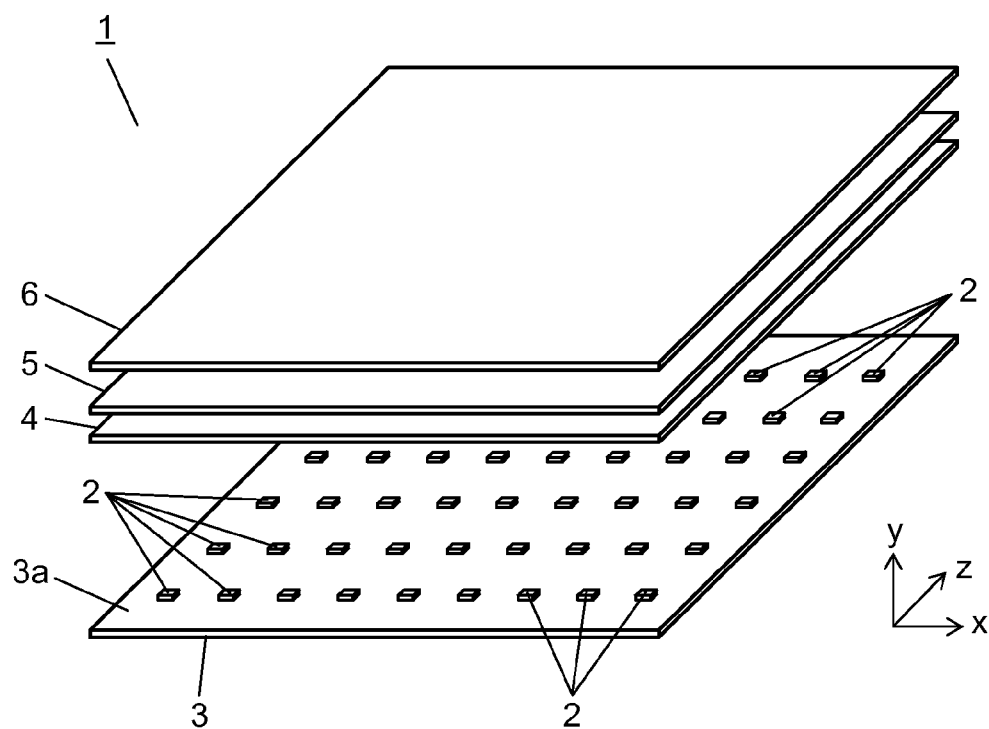
FIG. 1 is a perspective view illustrating an outline structure of a subjacent-type backlight unit according to an exemplary embodiment of the present invention.
Figure 2:
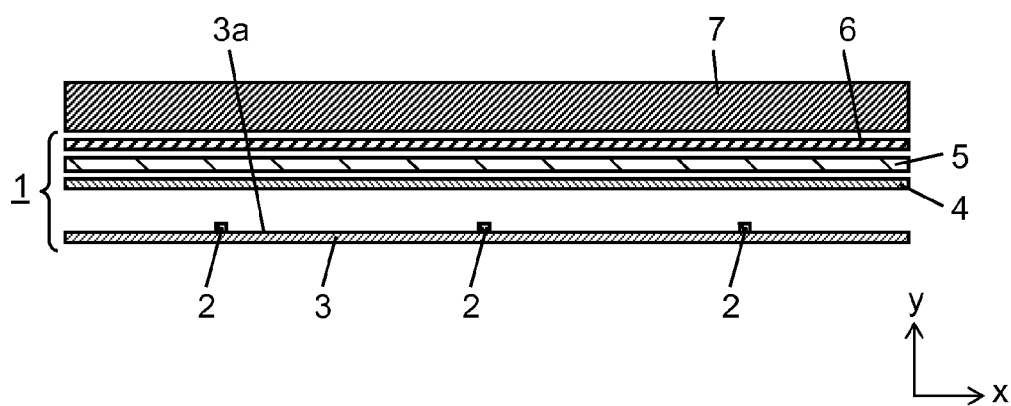
FIG. 2 is a cross sectional view illustrating an outline structure of a liquid crystal display apparatus using the backlight unit.

FIG. 1 is a perspective view illustrating an outline structure of a subjacent-type backlight unit according to the exemplary embodiment of the present invention, and FIG. 2 is a cross sectional view illustrating an outline structure of a liquid crystal display apparatus using the subjacent-type backlight unit illustrated in FIG. 1. FIG. 2 illustrates an outline cross section at a position including an optical axis of the LED in a plane taken along a line x-y of FIG. 1. Hereinafter, referring to FIGS. 1 and 2, a direction of an x-axis is referred to as a "transverse direction", a positive direction of a y-axis which is a direction in which light of subjacent-type backlight unit 1 exits is referred to as a "front direction", a negative direction of the y-axis is referred to as a "rear direction", a positive direction of a z-axis is referred to as an "upper direction", and a negative direction of the z-axis is referred to as a "lower direction".

As illustrated in FIGS. 1 and 2, in subjacent-type backlight unit 1, a plurality of LEDs 2 is laid at regular intervals in a matrix formation on a front surface of reflecting plate 3. Various types of optical sheets are disposed on a front direction side of LEDs 2 with a distance from LEDs 2. To be specific, diffusion sheet 4, wavelength conversion sheet 5, and luminance enhancing sheet 6 are arranged on the front direction side of LEDs 2.

Diffusion sheet 4 is a diffusion member that diffuses light from LEDs 2 and light reflected by reflecting plate 3 and forms a surface light source. Wavelength conversion sheet 5 is wavelength conversion means that allows part of light incident thereon through diffusion sheet 4 to pass therethrough and allows mixing the part of the light passing therethrough with other light of which wavelength is changed by wavelength conversion sheet 5 for producing light of white color. Luminance enhancing sheet 6 collects light and allows light to exit therefrom in a direction normal to an exit plane to thereby enhance frontal luminance of the exit light.

LEDs 2 are arbitrarily arranged in an optimum quantity and at optimum intervals according to the structure of subjacent-type backlight unit 1. For example, these are decided by a size and a thickness of subjacent-type backlight unit 1, a light distribution characteristic of LED 2, and the like.

Further, subjacent-type backlight unit 1 allows surface light of white color to exit from a surface on the front direction side of luminance enhancing sheet 6 serving as an exit plane of light. Here, the white color means a color having a color temperature in a range between 3000 K and 10000 K.

Reflecting plate 3 has a flat shape and is arranged on a rear direction side of LEDs 2. Reflecting plate 3 is provided with at least diffusion reflection surface 3a placed on its front surface on which LEDs 2 are laid and formed of white polyester. Light reached diffusion reflection surface 3a is diffused and reflected in a front direction. This means that the light reached reflecting plate 3 is diffused and reflected on the front direction side.

Diffusion sheet 4 has a flat shape and is disposed on the front direction side of LEDs 2 with a distance from LEDs 2 and reflecting plate 3. Diffusion sheet 4 diffuses light incident thereon from a side of LEDs 2, that is, a rear side of diffusion sheet 4. Diffusion sheet 4 controls light so that part of the light passes through diffusion sheet 4 and exits from a front surface in a front direction, and part of the light is reflected by diffusion sheet 4 and returns to a rear side thereof (side of LEDs 2).

Wavelength conversion sheet 5 has substantially a flat shape as an external shape and is disposed between diffusion sheet 4 and luminance enhancing sheet 6 which will be described later. Wavelength conversion sheet 5 has a phosphor film therein. The phosphor film is excited by blue light emitted by LEDs 2, converts the light into light of a specific color, that is, converts the wavelength of blue light in this exemplary embodiment into yellow light having a dominant emission wavelength on a long-wavelength side of 550 nm to 610 nm by an action of the phosphor film, and emits the resultant light in the front direction. To state it differently, part of blue light entering from a rear side passes through wavelength conversion sheet intact, and part of the blue light is converted into yellow light by the wavelength conversion action of the phosphor film and passes through wavelength conversion sheet 5. As a result of this, wavelength conversion sheet 5 mixes blue light and yellow light with each other and emits white light. When an amount of the blue light is larger, the resultant light becomes bluish white light, and, when an amount of the yellow light is larger, the resultant light becomes yellowish white light.

Luminance enhancing sheet 6 has a flat shape and is arranged in front of diffusion sheet 4. Luminance enhancing sheet 6 reflects part of incident light to a rear direction, allows part of the incident light to pass therethrough, and collects and emits light in a direction normal to the exit plane. With this arrangement, it increases a frontal luminance of the exit light. Specifically, a prism, for example, is provided in front of luminance enhancing sheet 6 so that only light of a predetermined angle can be emitted.

Subjacent-type backlight unit 1 is formed of the above-mentioned members. Additionally, as illustrated in FIG. 2, a liquid crystal display apparatus is configured when liquid crystal panel 7 for displaying images is placed in the front direction of subjacent-type backlight unit 1. Further, liquid crystal panel 7 is a panel formed to have a plurality of pixels by encapsulating liquid crystal between a substrate on which transparent electrodes and transistors as switching elements are formed and a substrate on which a deflection plate is provided. Then, individual pixels are switched according to an image signal to thereby adjust an amount of the backlight passing through the panel so that a desired image is displayed. It should be noted that, although FIG. 2 illustrates diffusion sheet 4, wavelength conversion sheet 5, and luminance enhancing sheet 6 with gaps provided therebetween for easy understanding, there is no need to provide such gaps for arranging individual sheets.

Next, LED 2 used for the backlight unit according to this exemplary embodiment will be described in detail.

Figure 3:
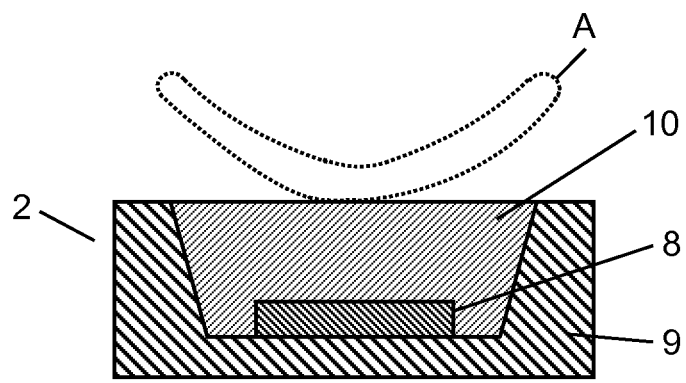
FIG. 3 is a cross sectional view illustrating a structure of an LED used for the backlight unit.

LED 2 emits blue light having a dominant emission wavelength of 430 nm to 480 nm. As illustrated in FIG. 3, LED 2 is formed by arranging LED chip 8 inside LED package 9 and encapsulating by resin 10 for protecting LED chip 8. LED chip 8 is electrically connected to a substrate (not illustrated) of LED package 9 by means of a wiring member. Here, the dominant emission wavelength means a wavelength at which a maximum emission intensity in an emission spectrum is achieved. Referring to FIG. 3, dotted line A schematically indicates an emission pattern of light of LED 2.

Figure 4:
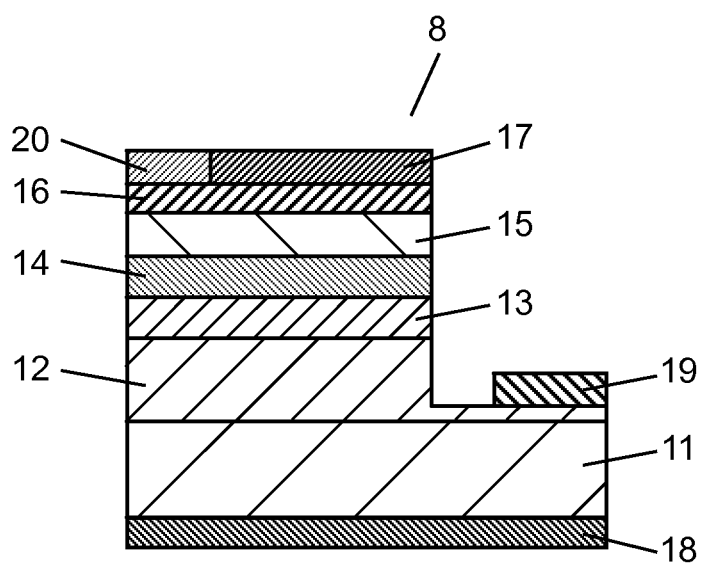
FIG. 4 is a cross sectional view schematically illustrating a structure of an LED chip of the LED.

FIG. 4 is a cross sectional view schematically illustrating a structure of LED chip 8. Referring to FIG. 4, reference mark 11 represents a transparent substrate made of sapphire. One of principal surfaces of substrate 11 includes n-type contact layer 12 formed of an n-type GaN film, n-type clad layer 13 formed of an n-type AlGaN film, light-emitting layer 14 which is formed of an InGaN film and is an active layer emitting light of a specific wavelength, p-type clad layer 15 formed of a p-type AlGaN film, and p-type contact layer 16 formed of a p-type GaN film, which are laminated thereon sequentially.

Mirror layer 17 serving as a first reflecting layer having a function of reflecting light emitted from light-emitting layer 14 is laminated on a light exit side relative to light-emitting layer 14 of the laminated body. As described later, mirror layer 17 is formed of dielectric multilayer film. According to this exemplary embodiment, mirror layer 17 is formed of a plurality of layers of $TiO_2$ and a plurality of layers of $SiO_2$.

Reference mark 18 represents a reflecting layer serving as a second reflecting layer, reference mark 19 represents an n-type electrode, and reference mark 20 represents a p-type electrode.

Reflecting layer 18 is provided on the other of the principal surfaces of substrate 11, and light-emitting layer 14 is sandwiched between reflecting layer 18 and mirror layer 17.

In addition, reflecting layer 18 is made of magnesium oxide (MgO). Accordingly, reflecting layer 18 includes a diffusion function for diffusing light emitted from light-emitting layer 14 and a reflecting function for reflecting light.

Referring to FIG. 4, light-emitting layer 14 emits light by applying a voltage between n-type electrode 19 and p-type electrode 20. Since light emitted from light-emitting layer 14 is isotropic light, part of the light emitted therefrom travels to reflecting layer 18 and mirror layer 17, part of the light is totally reflected by some of interfaces of the laminated body that forms LED 2, and part of the light is absorbed by some of materials of the laminated body that forms LED 2.

Reflectivity of mirror layer 17 is set to be lower than that of reflecting layer 18. Light emitted by light-emitting layer 14 repeats reflections and is extracted from mirror layer 17.

Figure 5:
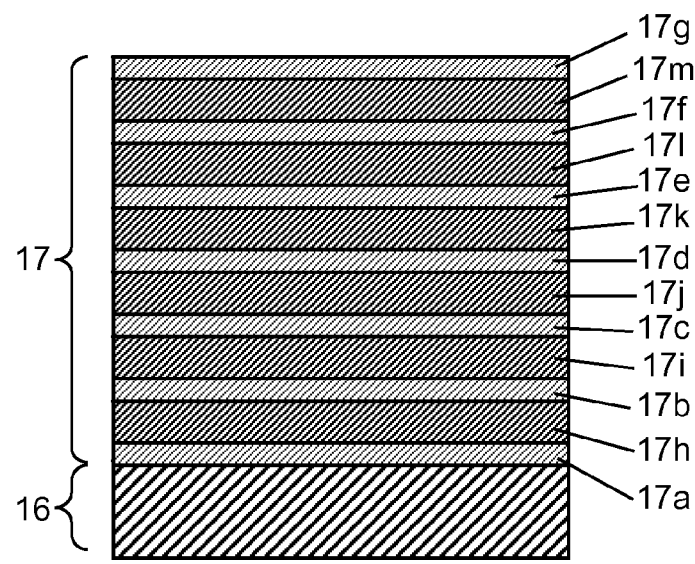
FIG. 5 is a cross sectional view schematically illustrating a structure of a mirror layer of the LED chip.

FIG. 5 is a cross sectional view of mirror layer 17. Referring to FIG. 5, mirror layer 17 is formed on p-type contact layer 16 and is formed of a dielectric multilayer film in which seven layers of high refractive index layers 17a, 17b, 17c, 17d, 17e, 17f, and 17g made of titanium dioxide ($TiO_2$) serving as a first dielectric, and six layers of low refractive index layers 17h, 17i, 17j, 17k, 17l, and 17m made of silicon dioxide ($SiO_2$) serving as a second dielectric are laminated alternately on top of one another. High refractive index layers 17a made of titanium dioxide makes contact with p-type contact layer 16.

Here, in high refractive index layers 17a to 17g formed of the first dielectric and low refractive index layers 17h to 17m formed of the second dielectric, which constitute mirror layer 17, each optical film thickness is set close to ¼ of a wavelength of the light from light-emitting layer 14 in the first dielectric and the second dielectric. Specifically, the thicknesses of the layers are, sequentially from a side of p-type contact layer 16, 25.0 nm for high refractive index layer 17a, 83.3 nm for low refractive index layer 17h, 49.0 nm for high refractive index layer 17b, 80.0 nm for low refractive index layer 17i, 47.5 nm for high refractive index layer 17c, 78.3 nm for low refractive index layer 17j, 45.5 nm for high refractive index layer 17d, 73.3 nm for low refractive index layer 17k, 42.0 nm for high refractive index layer 17e, 66.7 nm for low refractive index layer 17l, 38.0 nm for high refractive index layer 17f, 60.0 nm for low refractive index layer 17m, and 18.0 nm for high refractive index layer 17g. Here, a refractive index of titanium dioxide at a wavelength of 450 nm is 2.5, and a refractive index of silicon dioxide at a wavelength of 450 nm is 1.5.

Figure 6:
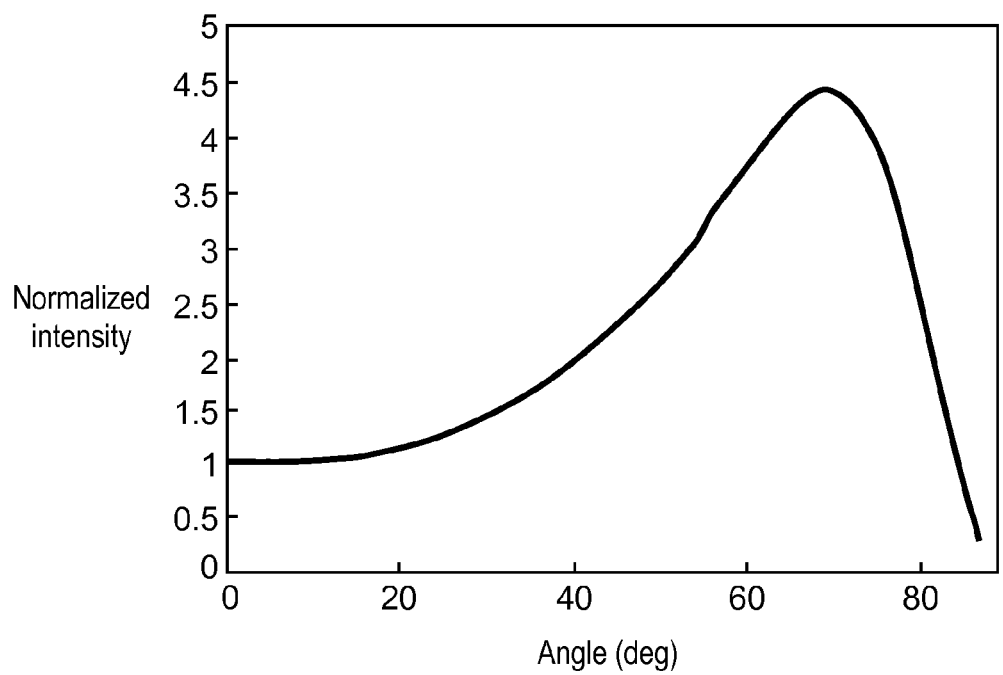
FIG. 6 is a diagram illustrating an angular characteristic of relative intensity of light outputted from the LED.

In this way, by forming mirror layer 17 of LED chip 8 by using the dielectric multilayer film formed of the first dielectric and the second dielectric having refractive index different from each other, it is possible to realize an angular distribution having a peak of transmittance at an angle equal to or larger than 65 degrees at a dominant emission wavelength of 450 nm from light-emitting layer 14, and realize LED 2 having a light distribution characteristic illustrated in FIG. 6.

FIG. 6 is a diagram illustrating an example of an angular characteristic of relative intensity of light outputted from LED 2 having the above-mentioned structure illustrated in FIGS. 4 and 5. In the characteristic illustrated in FIG. 6, light emitted from light-emitting layer 14 is isotropic light. In addition, the characteristic illustrated in FIG. 6 is based on normalization in which intensity of light outputted in the front direction, where an output angle is 0 degrees, is assumed as 1.

Incidentally, when reflecting layers are disposed to sandwich a light-emitting layer in a general LED, a resonator structure is formed by the reflecting layers, and directivity of light outputted from the LED makes a distribution close to Lambertian distribution. Specifically, intensity of light becomes maximum at an output angle of 0 degrees, and an angular distribution proportional to cosine of the output angle is formed.

In contrast, in LED 2 according to this exemplary embodiment, since reflecting layer 18 having a diffusion function is provided, i.e., a light diffusion function is provided between reflecting layer 18 and mirror layer 17, a light interference effect exerted by mirror layer 17 and reflecting layer 18 that are disposed to sandwich light-emitting layer 14 therebetween can be suppressed. As a result, as illustrated in FIG. 6, it is possible to easily control the characteristic to become a light distribution characteristic with wider distribution in which intensity of light increases as the output angle becomes larger and becomes a maximum at an output angle near 70 degrees which is equal to or larger than 65 degrees.

Specifically, in LED 2 according to this exemplary embodiment, a half of light emitted from light-emitting layer 14 travels to a side of reflecting layer 18. Since reflecting layer 18 is a reflecting layer including a diffusion function formed of MgO, light reflected by reflecting layer 18 is subjected to diffuse reflection and travels to a side of mirror layer 17. Since a surface of reflecting layer 18 is formed of MgO, the reflected light is diffused.

With reflecting layer 18 including such a diffusion function, a light interference effect exerted by reflecting layer 18 and mirror layer 17 can be suppressed. As a result, a light distribution characteristic of light outputted from LED 2 does not exhibit such a characteristic in which intensity of light becomes maximum at an output angle of light of 0 degrees. Additionally, by arranging the angular characteristic of transmittance and reflectivity of mirror layer 17 to become such a characteristic in which a peak of transmittance is present at an output angle of 65 degrees or larger, and, at the same time, by considering a distribution characteristic of light emitted from light-emitting layer 14, the light distribution characteristic of LED 2 can be easily controlled to become a light distribution characteristic with wider distribution as illustrated in FIG. 6.

Here, one example of a manufacturing method of LED chip 8 according to this exemplary embodiment will be described.

First, MgO is coated on the other, i.e., lower side, of the principal surfaces of substrate 11. Next, n-type contact layer 12, n-type clad layer 13, light-emitting layer 14, p-type clad layer 15, and p-type contact layer 16 are sequentially laminated on one, i.e., an upper side, of the principal surfaces of substrate 11 using an MOCVD method. Subsequently, mirror layer 17 as the first reflecting layer is formed on p-type contact layer 16 by applying a multilayer coating of $TiO_2$ and $SiO_2$. Then, a portion in which n-type electrode 19 is formed is removed from a side of mirror layer 17 to a midway of n-type contact layer 12 by ion beam etching, and a portion in which p-type electrode 20 is formed is removed up to a surface of p-type contact layer 16 by etching. Subsequently, vacuum deposition is performed on an exposed portion of n-type contact layer 12 for forming n-type electrode 19, and on p-type contact layer 16 for forming p-type electrode 20, and annealing is performed in a nitrogen atmosphere to form ohmic electrodes.

By the above-mentioned process, LED chip 8 illustrated in FIGS. 4 and 5 can be obtained.

Figure 7:
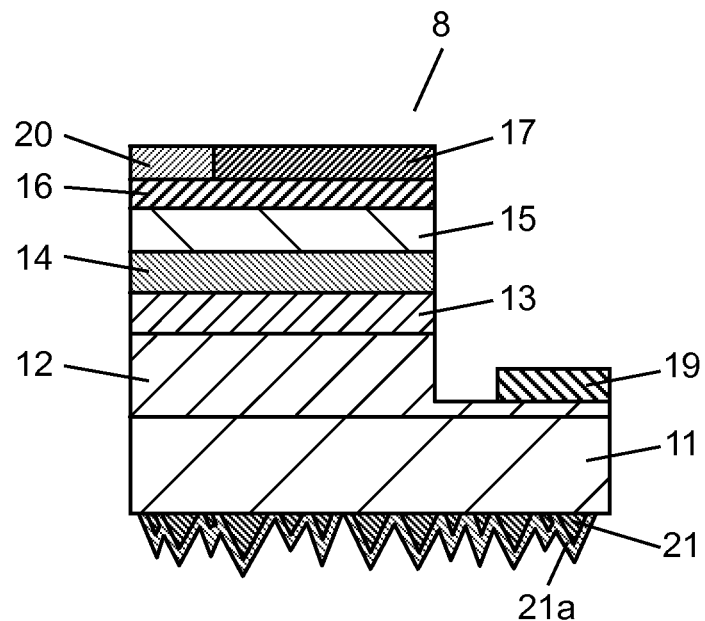
FIG. 7 is a cross sectional view schematically illustrating a structure of an LED chip according to another example of the LED.

According to the example illustrated in FIG. 4, reflecting layer 18 is configured so that it includes a diffusion function for diffusing light emitted from light-emitting layer 14 by forming reflecting layer 18 made of MgO on the other of the principal surfaces of substrate 11. Alternatively, as illustrated in FIG. 7, this may be configured in such a way that reflecting layer 21 is formed, by providing to a surface thereof a plurality of recess and a plurality of protrusion that diffuse and reflect light, on the other of the principal surfaces of substrate 11. According to the example illustrated in FIG. 7, the plurality of recess and the plurality of protrusion are formed at random on the other of the principal surfaces of substrate 11 by, for example, sandblasting, and metallic film 21*a* made of Ag or the like is formed on a surface of the plurality of recess and a plurality of protrusion to thereby form reflecting layer 21. With this structure, a surface of metallic film 21*a* serves a diffusion function for diffusing light emitted from light-emitting layer 14.

In the above-mentioned example, reflecting layers 18 and 21 provided with a diffusion function are formed on the other of the principal surfaces of substrate 11. Alternatively, as illustrated in FIG. 8, this may be configured in such a way that reflecting layer 22 made of metal such as Ag is formed on the other of the principal surfaces of substrate 11, and diffusion layer 23 formed of an opal diffusion plate is formed on one of the principal surfaces of substrate 11 so that a diffusion function for diffusing light emitted from light-emitting layer 14 is provided between light-emitting layer 14 and reflecting layer 22.

With this structure, light incident from a side of light-emitting layer 14 or reflecting layer 22 on diffusion layer 23 formed of the opal diffusion plate is diffused, and therefore light interference effect exerted by reflecting layer 18 and mirror layer 17 as described earlier can be suppressed. Accordingly, the distribution characteristic of light outputted from LED 2 does not become such a characteristic in which intensity of light becomes maximum at an output angle of light of 0 degrees. As a result, as illustrated in FIG. 6, a backlight unit having a light distribution characteristic with wider distribution, inexpensive, and having a high efficiency can be provided. Also, in the example illustrated in FIG. 8, a structure is provided in that reflecting layer 22 made of metal such as Ag is formed on the other of the principal surfaces of substrate 11, and diffusion layer 23 is formed on one of the principal surfaces of substrate 11. Therefore, only a laminated structure including light-emitting layer 14 is formed after formation of reflecting layer 22 and diffusion layer 23 on substrate 11. This provides an effect of easy manufacturing.

Figure 8:
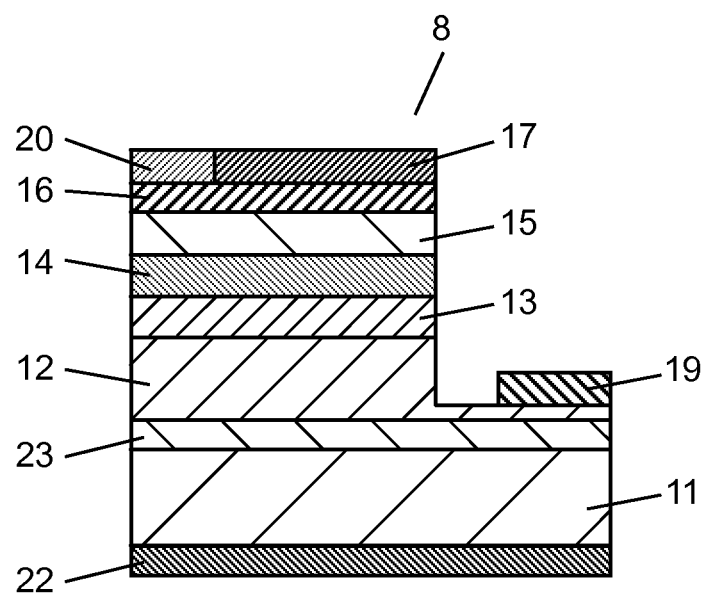
FIG. 8 is a cross sectional view schematically illustrating a structure of an LED chip according to still another example of the LED.

In the example illustrated in FIG. 8, diffusion layer 23 formed of an opal diffusion plate is formed on one of principal surfaces of substrate 11 and arranged between reflecting layer 22 and light-emitting layer 14. Alternatively, diffusion layer 23 formed of an opal diffusion plate may be arranged between light-emitting layer 14 and mirror layer 17 which is the first reflecting layer. In conclusion, diffusion layer 23 for diffusing light emitted from light-emitting layer 14 may be arranged between mirror layer 17 which is the first reflecting layer and reflecting layer 22 which is the second reflecting layer.

As described above, in this exemplary embodiment, the backlight unit includes LED 2 that is light-emitting means for emitting light of specific color and diffusion sheet 4 that is a diffusion member serving as a surface light source for diffusing the light from LED 2; LED 2 includes light-emitting layer 14 provided on transparent substrate 11 and emitting light of a specific wavelength, mirror layer 17 formed on a light exit side relative to the light-emitting layer 14 and including a function of reflecting light emitted from the light-emitting layer 14, and reflecting layer 18 provided on a side of substrate 11 in a manner to interpose light-emitting layer 14 between mirror layer 17 and reflecting layer 18; and reflecting layer 18 includes a diffusion function for diffusing light emitted from light-emitting layer 14. With this structure, since a light interference effect exerted by reflecting layer 18 and mirror layer 17 is suppressed. In addition, an angular characteristic of transmittance and reflectivity of mirror layer 17, i.e., a characteristic in which a peak of transmittance is designed to an output angle of 65 degrees or larger, as illustrated in FIG. 6, it is possible to easily control the characteristic to become a light distribution characteristic with wider distribution, and provide an inexpensive and high-efficient backlight unit.

Figure 9:
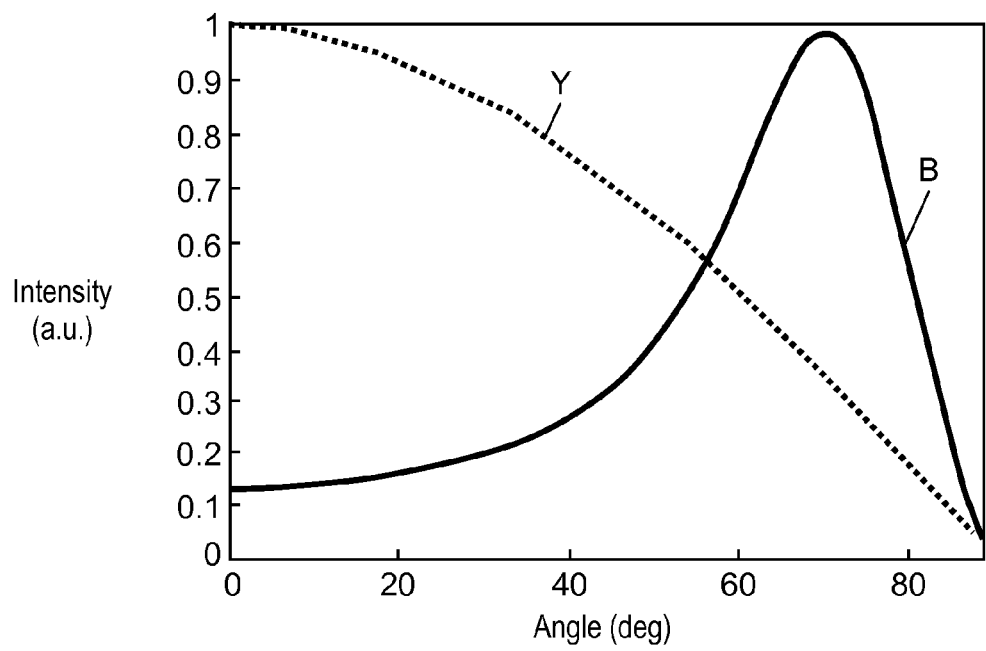
FIG. 9 is a diagram illustrating an angular characteristic of intensity of blue light of the LED and yellow light from a phosphor.

Incidentally, when light itself which is emitted from LED 2 is arranged to be distributed widely without using a lens, blue light emitted from LED chip 8 is widely distributed as indicated by characteristic B in FIG. 9. However, a light distribution characteristic of yellow light having a dominant emission wavelength between 550 nm and 610 nm which is emitted from a phosphor film that is excited by blue light from LED 2 becomes Lambertian distribution as indicated by characteristic Y. This means that light distribution characteristics of blue light and yellow light outputted from LED package 9 are different from each other, while the yellow light has a maximum value of intensity in a direction immediately above LED 2, the blue light has a maximum value of intensity at an angle of 65 degrees or larger and near 70 degrees. For this reason, the light becomes yellowish white immediately above LED 2 and bluish white at an angle of about 70 degrees. This results in different colors depending on the angle, and causes uneven color.

Figure 10:
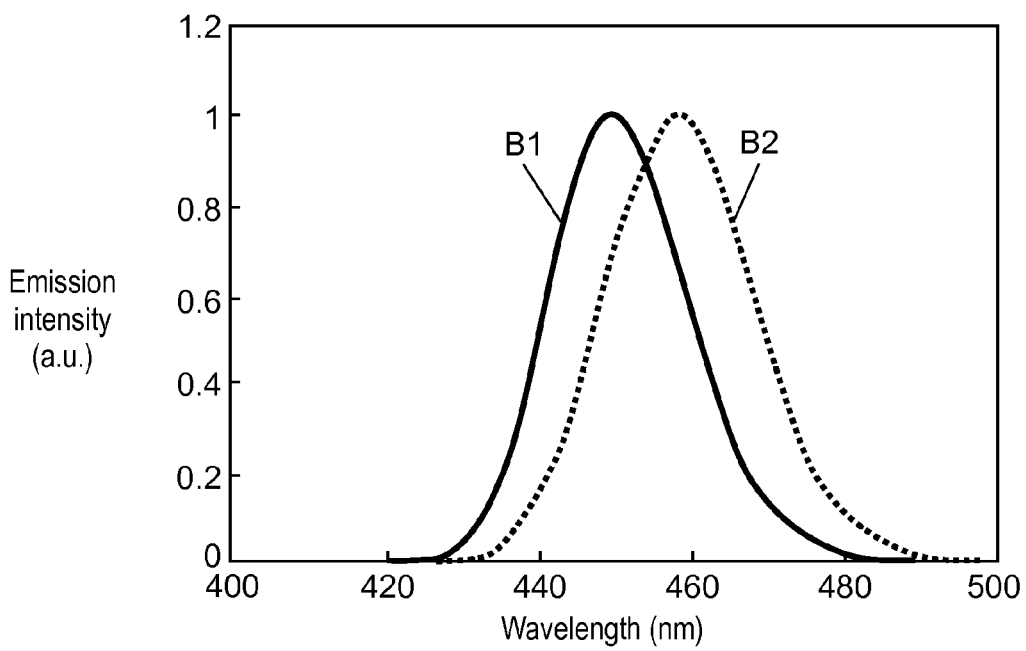
FIG. 10 is a diagram illustrating an emission spectrum at angles of 0 degrees and 60 degrees of blue light emitted from the LED.

Further, when a dielectric multilayer film is used as mirror layer 17 on a light exit side so as to widen the light distribution, constructive wavelengths and destructive wavelengths, which are caused by interference of light, are present in the dielectric multilayer film, which results in different emission spectra depending on the angle. FIG. 10 illustrates one example of a spectrum of a blue LED. As illustrated in FIG. 10, it is understood that a spectrum of light B2 outputted in a direction of 60 degrees is shifted by about 10 nm to a longer wavelength side relative to light B1 outputted in a direction of 0 degrees. In addition, as illustrated in FIG. 10, since the emission spectrum changes according to the angle, chromaticity also deviates.

Figure 11:
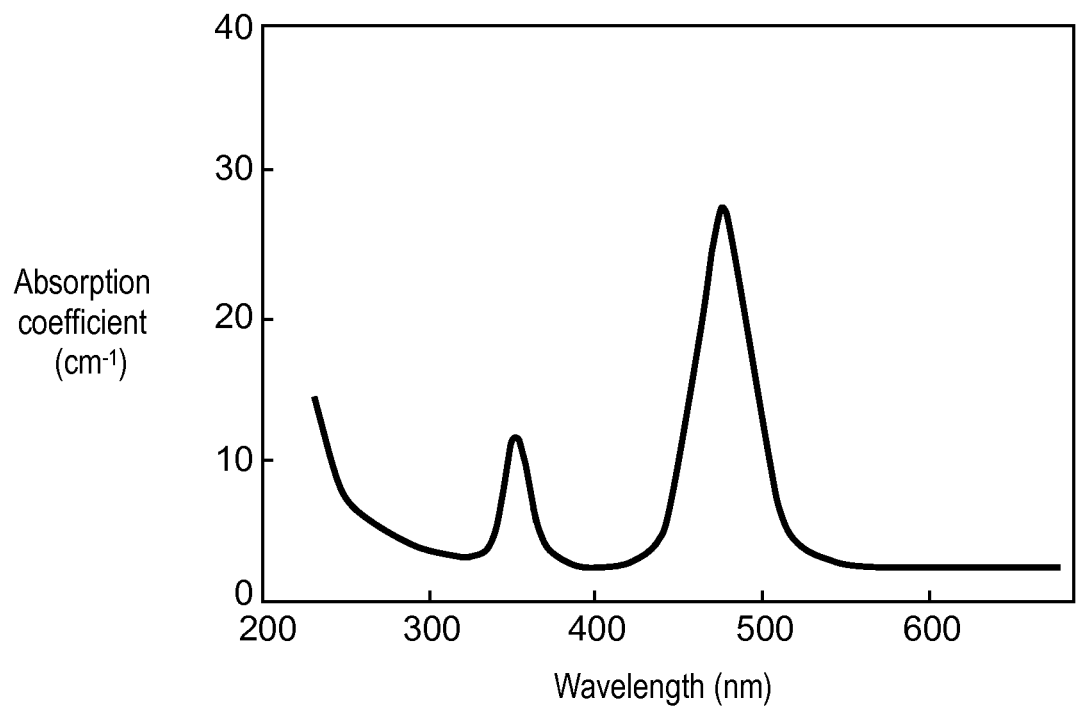
FIG. 11 is a diagram illustrating one example of an absorption spectrum of a yellow phosphor.
Figure 12A:
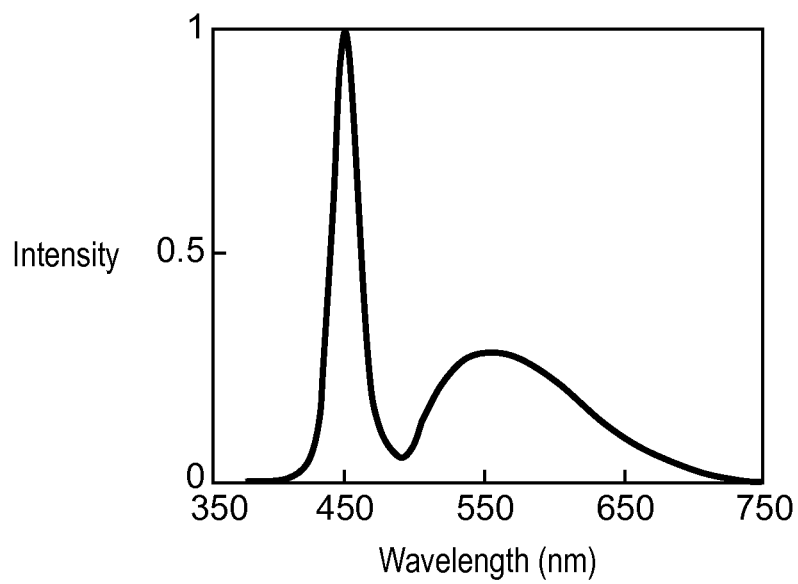
FIG. 12A is a diagram illustrating one example of a spectrum of white light in a 0-degree direction after light passes through a phosphor layer of the LED.
Figure 12B:
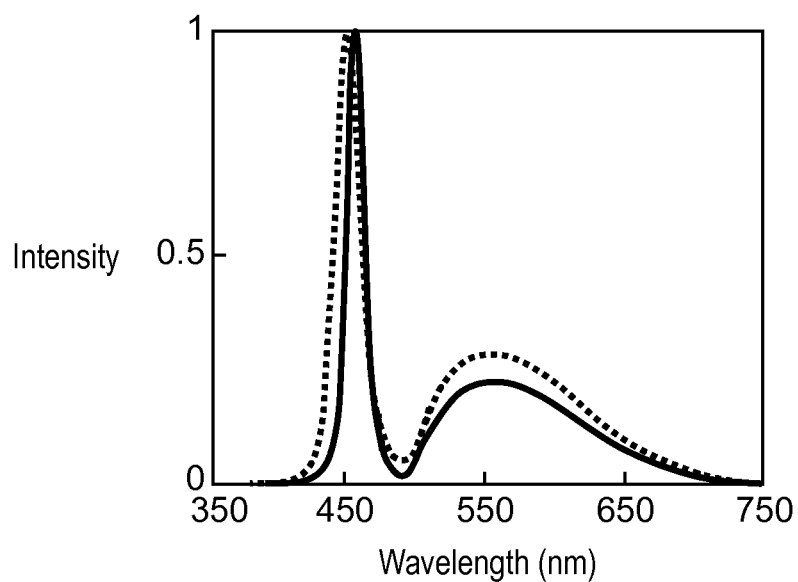
FIG. 12B is a diagram illustrating one example of a spectrum of white light in a 60-degree direction after light passes through a phosphor layer of the LED.

FIG. 11 illustrates one example of an absorption spectrum of a phosphor that emits yellow light. A peak in the absorption spectrum is at around 450 nm as in the case of the emission spectrum in a direction of 0 degrees, and an absorption coefficient decreases on a long wavelength side equal to or higher than 450 nm. This means that an absorption amount of light of the phosphor decreases, and an emission intensity of the yellow phosphor that is excited becomes smaller. Accordingly, light in a direction of 0 degrees after passing through the phosphor has a spectrum illustrated in FIG. 12A, and light in a direction of 60 degrees has a spectrum illustrated in FIG. 12B. According to FIG. 12B, the emission intensity of the yellow phosphor becomes smaller relative to the emission intensity of the blue LED, and the color changes between 0 degrees and 60 degrees, and, as a result, uneven color is caused in the backlight unit.

In contrast, in the backlight unit according to this exemplary embodiment, the blue light outputted from LED 2 shows, as described above, the light distribution characteristic as illustrated in FIG. 6, and blue light having this light distribution characteristic passes through diffusion sheet 4 and enters wavelength conversion sheet 5. Then, part of blue light incident on wavelength conversion sheet 5 passes therethrough intact, and remainder blue light is converted into yellow light by the wavelength conversion action of the phosphor and passes therethrough. During such a process, since the light distribution characteristic of the blue light immediately after it passes wavelength conversion sheet 5 and the yellow light converted by the wavelength conversion action of the phosphor show the same illumination distribution, and additionally the both show the Lambertian distribution characteristic, the blue light and the yellow light show the same characteristic. As a result, the uneven color as discussed above can be suppressed, and an improvement in an image quality for the liquid crystal display apparatus can be achieved.

In the description above, although wavelength conversion sheet 5 is arranged between diffusion sheet 4 and luminance enhancing sheet 6, the location is not restricted to this. For example, wavelength conversion sheet 5 may be arranged between reflecting plate 3 and diffusion sheet 4. In short, if wavelength conversion sheet 5 is arranged between reflecting plate 3 and luminance enhancing sheet 6, it is possible to provide an effect of reducing uneven color.

In addition, if a diffusion plate having a high mechanical strength is used instead of diffusion sheet 4 as a diffusion member, it is possible to allow this diffusion plate to hold other optical sheet. In such a case, wavelength conversion sheet 5 may be arranged between the diffusion plate and luminance enhancing sheet 6.

Although luminance enhancing sheet 6 is configured so that it reflects part of incident light toward a rear side, allows part of incident light to pass therethrough and be collected and emitted in a direction normal to an exit plane, and thereby enhances frontal luminance of the exit light, the structure thereof is not restricted to this. For example, as long as it reflects part of incident light to a rear side, it may be configured differently. Also, it may be configured so that, when a liquid crystal display apparatus is formed, only a polarization component which is absorbed by liquid crystal panel 7 is reflected, and remainder light is allowed to pass through.

Further, in this exemplary embodiment, although wavelength conversion sheet 5 is configured so that it is provided with a phosphor film for converting blue light into yellow light, the structure is not restricted to this. For example, wavelength conversion sheet 5 may be provided with a phosphor film for converting blue light into red light and a phosphor film for converting blue light into green light. According to this structure, it is possible to generate white light by performing a color mixture between blue light from LED 2 which is light emitting means and red and green light whose wavelength is converted by wavelength conversion sheet 5.

Figure 13:
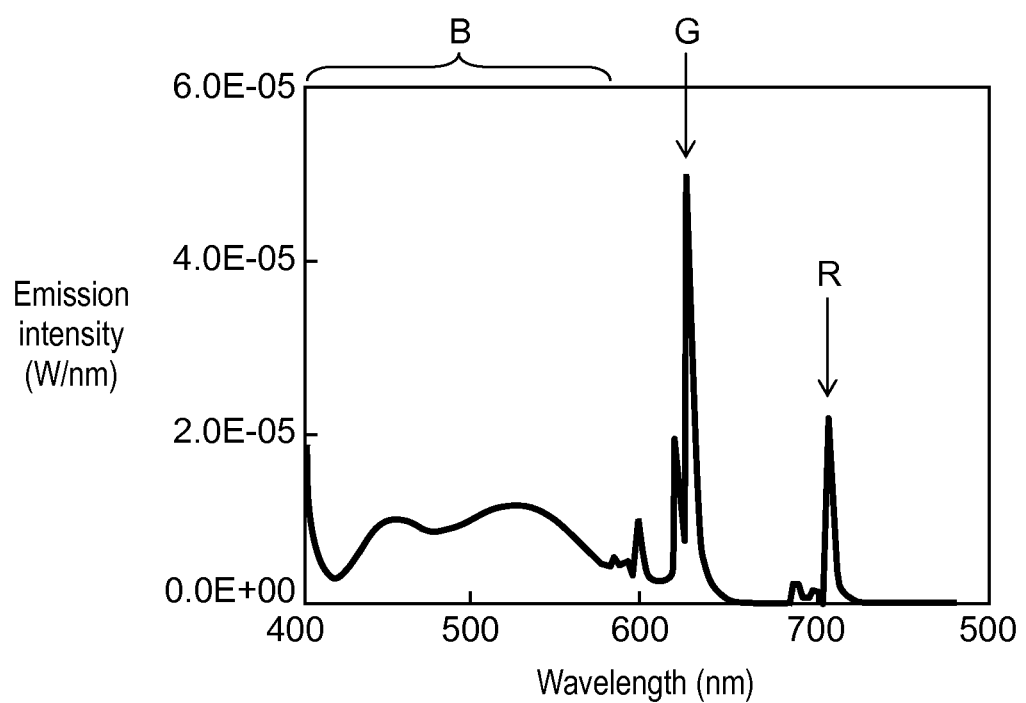
FIG. 13 is a diagram illustrating one example of a spectrum of a white LED resulted from color mixture of light of an ultraviolet light LED, and light of red, blue, and green phosphors.

Further, it is also possible to use an LED as LED 2 which emits ultraviolet light having a dominant emission wavelength of 350 nm to 400 nm. Then, as illustrated in FIG. 13, as wavelength conversion sheet 5, a sheet on which phosphor films of R, G, and B having characteristics of emitting red, blue, and green light by being excited by the ultraviolet light of the LED are formed may be used so that light of white color is achieved by mixing light of blue, green, and red. When the LED emitting the ultraviolet light is used, since the ultraviolet light is not used as part of white color, the uneven color is not affected by the change of chromaticity of LED and is only affected by an excitation efficiency of the phosphor, it is possible to realize a backlight unit having further reduced uneven color.

Figure 14:
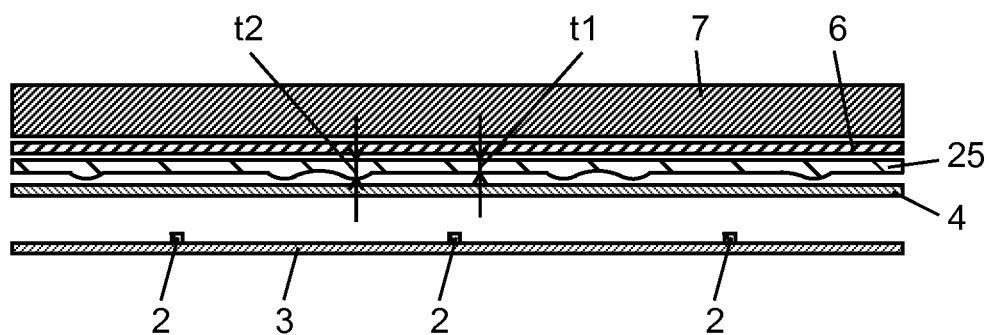
FIG. 14 is a cross sectional view illustrating an outline structure of a liquid crystal display apparatus using a backlight unit according to another exemplary embodiment of the present invention.
Figure 15:
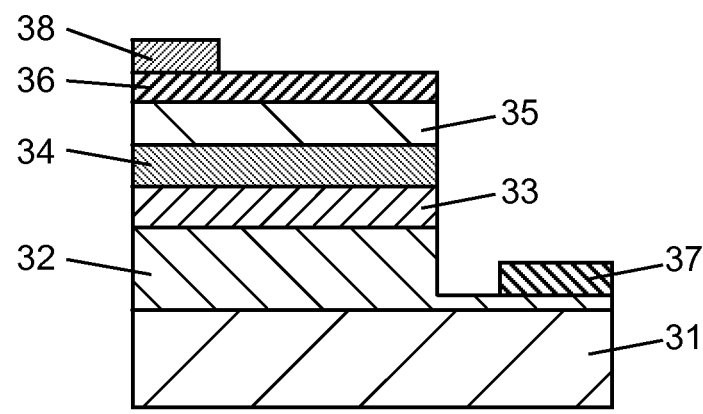
FIG. 15 is a cross sectional view schematically illustrating a structure of an LED chip of a conventional LED.

Next, another exemplary embodiment will be described. FIG. 14 is a cross sectional view illustrating an outline structure of a liquid crystal display apparatus using a subjacent-type backlight unit according to another exemplary embodiment.

In this exemplary embodiment, wavelength conversion sheet 25 is used as the wavelength conversion means that is configured so that a thickness thereof is thicker near an angle where intensity shows a maximum value.

Specifically, as illustrated in FIG. 14, wavelength conversion sheet 25 is configured in such a way that thickness t2 thereof outside an optical axis of LED 2 and near an angle at which intensity of LED 2 shows a maximum value is made thicker than thickness t1 in the optical axis of LED 2. The thickness of wavelength conversion sheet 25 in the optical axis of LED 2 is t1, and the thickness becomes thinner as a location is distanced farther away from the optical axis. Then, the thickness becomes t2 which is larger than t1 at an angle at which a change of chromaticity becomes the largest. Thickness t1 in the optical axis of LED 2 is identical in each LED 2, and the change of thickness of wavelength conversion sheet 25 is distributed concentrically with the optical axis of LED 2 as a center.

In LED 2 according to this exemplary embodiment, when a dielectric multilayer film is used as mirror layer 17, constructive wavelengths and destructive wavelengths, which are caused by interference of light, are present, and, when the output angle of LED 2 is different, the spectrum of light becomes different as illustrated in FIG. 10. These cause a reduction in the excitation efficiency of the phosphor, and cause uneven color as a result.

With the structure according to this exemplary embodiment, it is possible to make the emission intensity of the yellow phosphor film almost equal to the emission intensity of the blue light of LED 2, and provide a backlight unit with reduced amount of uneven color.

INDUSTRIAL APPLICABILITY

As described above, the present invention is effective in providing an inexpensive and high-efficient backlight unit and improving an image quality of a liquid crystal display apparatus.

REFERENCE MARKS IN THE DRAWINGS

1: Subjacent-type backlight unit
2: LED
3: Reflecting plate
4: Diffusion sheet
5, 25: Wavelength conversion sheet
6: Luminance enhancing sheet
7: Liquid crystal panel
8: LED chip
9: LED package
10: Resin
11: Substrate
12: n-type contact layer
13: n-type clad layer
14: Light-emitting layer
15: p-type clad layer
16: p-type contact layer
17: Mirror layer
17a to 17g: High refractive index layer
17h to 17m: Low refractive index layer
18, 21, 22: Reflecting layer
19: n-type electrode
20: p-type electrode
21a: Metallic film
23: Diffusion layer

The invention claimed is:

1. A backlight unit comprising:
light-emitting diodes, each of which emits light of a specific color, wherein each of the light-emitting diodes comprises:
a transparent substrate having an upper surface and a bottom surface opposite to the upper surface;
a light-emitting layer, provided on the upper surface of the transparent substrate, for emitting light of a specific wavelength;
a first reflecting layer formed on the light-emitting layer at a light exit side relative to the light-emitting layer and including a function of reflecting the light emitted from the light-emitting layer; and
a second reflecting layer provided on the bottom surface of the substrate in a manner to interpose the light-emitting layer between the first reflecting layer and the second reflecting layer,
wherein a diffusion layer that diffuses the light emitted from the light-emitting layer is disposed between the first reflecting layer and the second reflecting layer.

2. The backlight unit according to claim 1, further comprising wavelength convertor that passes a part of the light emitted from the light-emitting diode and converts wavelength of the passed light so that, when the wavelength-converted light is mixed with other light, the mixed light produces white color.

3. The backlight unit according to claim 1, wherein the diffusion layer of the light-emitting diode is disposed between the light-emitting layer and the first reflecting layer or between the light-emitting layer and the second reflecting layer.

4. The backlight unit according to claim 1, wherein the diffusion layer of the light-emitting diode is configured by providing a diffusion function for diffusing the light emitted from the light-emitting layer to the second reflecting layer.

5. The backlight unit according to claim 1, wherein the first reflecting layer of the light-emitting diode is configured to have a peak of transmittance when an output angle is 65 degrees or larger at a dominant emission wavelength from the light emitting layer.

6. The backlight unit according to claim 1, wherein the first reflecting layer of the light-emitting diode is formed of a dielectric multilayer film.

7. The backlight unit according to claim 6, wherein the dielectric multilayer film is formed of a first dielectric and a second dielectric having refractive index different from each other, and individual optical film thicknesses thereof are set close to ¼ of a wavelength of the light from the light-emitting layer in the first dielectric and the second dielectric.

8. The backlight unit according to claim 2, wherein the light-emitting diode is a blue light-emitting diode that emits blue light having a dominant emission wavelength of 430 nm to 480 nm, and the wavelength convertor includes a phosphor film that, by being excited by the blue light of the blue light-emitting diode, emits light of a specific color which forms light of white color by being mixed with light of blue color.

9. The backlight unit according to claim 2, wherein the light-emitting diode emits ultraviolet light having a dominant emission wavelength of 350 nm to 400 nm, and the wavelength convertor includes phosphor films that are excited by the ultraviolet light of the light-emitting diode and individually emit light of red, blue, and green colors.

10. The backlight unit according to claim 2, wherein the wavelength convertor is configured to have a large thickness near an angle at which intensity has a maximum value.

11. A liquid crystal display apparatus comprising:
a backlight unit including light-emitting diodes, each of which emits light of a specific color; and
a liquid crystal panel configured to receive light from the backlight unit incident on a rear side thereof and display an image,
wherein each of the light-emitting diodes includes:
a transparent substrate having an upper surface and a bottom surface opposite to the upper surface;
a light-emitting layer, provided on the upper surface of the transparent substrate, for emitting light of a specific wavelength;
a first reflecting layer formed on the light-emitting layer at a light exit side relative to the light-emitting layer and including a function of reflecting the light emitted from the light-emitting layer; and
a second reflecting layer provided on the bottom surface of the substrate in a manner to interpose the light-emitting layer between the first reflecting layer and the second reflecting layer,
wherein a diffusion layer that diffuses the light emitted from the light-emitting layer is disposed between the first reflecting layer and the second reflecting layer.

12. The liquid crystal display apparatus according to claim 11, wherein the backlight unit further comprises wavelength convertor that passes a part of the light emitted from the light-emitting diode and converts wavelength of the passed light so that, when the wavelength-converted light is mixed with other light, the mixed light produces white color.

13. The liquid crystal display apparatus according to claim 11, wherein the diffusion layer of the light-emitting diode is disposed between the light-emitting layer and the first reflecting layer or between the light-emitting layer and the second reflecting layer.

14. The liquid crystal display apparatus according to claim 11, wherein the diffusion layer of the light-emitting diode is configured by providing a diffusion function for diffusing the light emitted from the light-emitting layer to the second reflecting layer.

15. A light-emitting diode comprising:
a transparent substrate having an upper surface and a bottom surface opposite to the upper surface;
a light-emitting layer, provided on the upper surface of the transparent substrate, for emitting light of a specific wavelength;
a first reflecting layer formed on the light-emitting layer at a light exit side relative to the light-emitting layer and including a function of reflecting the light emitted from the light-emitting layer; and
a second reflecting layer provided on the bottom surface of the substrate in a manner to interpose the light-emitting layer between the first reflecting layer and the second reflecting layer,
wherein a diffusion layer that diffuses the light emitted from the light-emitting layer is disposed between the first reflecting layer and the second reflecting layer.

16. The light-emitting diode according to claim 15, wherein the diffusion layer is disposed between the light-emitting layer and the first reflecting layer or between the light-emitting layer and the second reflecting layer.

17. The light-emitting diode according to claim 15, wherein the diffusion layer is configured by providing a diffusion function for diffusing the light emitted from the light-emitting layer to the second reflecting layer.

18. The light-emitting diode according to claim 15, wherein:
the second reflecting layer includes, as the diffusion layer, is on a surface of the second reflecting layer, a recess and protrusion for diffusing and reflecting the light emitted from the light-emitting layer.

19. The light-emitting diode according to claim 15, wherein the first reflecting layer is configured to have a peak of transmittance when an output angle is 65 degrees or larger at a dominant emission wavelength from the light emitting layer.

20. The light-emitting diode according to claim 15, wherein a reflectivity of the first reflecting layer is smaller than a reflectivity of the second reflecting layer.

* * * * *